United States Patent [19]

Robinson

[11] 4,323,294
[45] Apr. 6, 1982

[54] METER SOCKET COVER ASSEMBLY

[75] Inventor: Darrell Robinson, Milford, Mich.

[73] Assignee: Ekstrom Industries, Inc., Farmington Hills, Mich.

[21] Appl. No.: 103,464

[22] Filed: Dec. 14, 1979

[51] Int. Cl.³ .............................................. H01R 31/08
[52] U.S. Cl. ..................................... 339/19; 361/367; 339/198 M
[58] Field of Search ..................... 339/19, 198 M, 222; 361/367

[56] References Cited

U.S. PATENT DOCUMENTS 3,029,322  4/1962  Waldrop ........................... 339/19 X
3,806,857  4/1974  Hubeny ............................... 339/19

FOREIGN PATENT DOCUMENTS 2256373  11/1972  Fed. Rep. of Germany ........ 339/19

Primary Examiner—Mark Rosenbaum
Assistant Examiner—Frank H. McKenzie, Jr.
Attorney, Agent, or Firm—Robert E. Ross

[57] ABSTRACT

A meter socket jumper assembly comprising a plastic disc having a diameter and an edge thickness substantially the same dimensions as a meter of the type designed for assembly in said socket. Said disc is provided with a series of integrally molded pockets shaped and dimensioned to receive a fastener such as a self tapping screw from the rear side to retain a jumper bar on said rear side. Said pockets are so designed that the self tapping screw assembled therein is not exposed on the front face of the disc. In a preferred embodiment of the invention the pockets protrude from the front of the disc and intersect stiffening ribs molded into the face of the cover, to strengthen the pocket walls against the expansive force of the fasteners inserted therein from the rear side.

A plurality of pockets are provided, suitably spaced to allow the assembly of jumpers in several different predetermined positions to accomodate different types of meter sockets.

2 Claims, 5 Drawing Figures

METER SOCKET COVER ASSEMBLY

BACKGROUND OF THE INVENTION

In electric power distribution, meters for measuring power consumption are customarily provided with rearwardly extending contact blades for insertion into and frictional engagement with a meter socket having spring jaw connectors. The meter is held in place by a meter ring which clamps a meter flange to a support member associated with the meter socket, or by a cover plate having an aperture receiving the meter housing, the periphery of which covers the meter flange.

In situations where it is necessary to provide temporary power without a meter in the meter socket, or where it is desired to bypass the meter socket, it is necessary to provide jumper means for connecting the live terminals of the meter socket to the load terminals thereof.

Although it has been possible to do this with jumper cables or connectors, this procedure could leave the contacts exposed to the weather and also susceptible to accidental or intentional contact by unauthorized personnel.

SUMMARY OF THE INVENTION

A meter socket jumper comprises a plastic disc having a diameter and a peripheral thickness the same dimensions as the retaining ring of a meter designed for assembly into said socket. The disc has integrally molded pockets opening to the rear or inside face of the disc only, said pockets being dimensioned to receive self tapping screws to allow attachment of a conductive jumper to the rear face of the disc.

The molded pockets protrude forwardly from the front face of the disc, and stiffening webs intersect the pockets to strengthen them against expansion and lateral movement when a screw is assembled therein.

A plurality of pockets are provided at predetermined positions on the disc to allow assembly of jumpers at different positions to allow the device to be used with meter sockets of various types.

The jumpers are provided with contact blades for assembly into the jaw contacts of the meter socket, thereby retaining the device in position until the meter box cover is closed, or until a retaining ring is assembled, depending on the type of meter socket.

DESCRIPTION OF THE ILLUSTRATED EMBODIMENT

Figure 1:
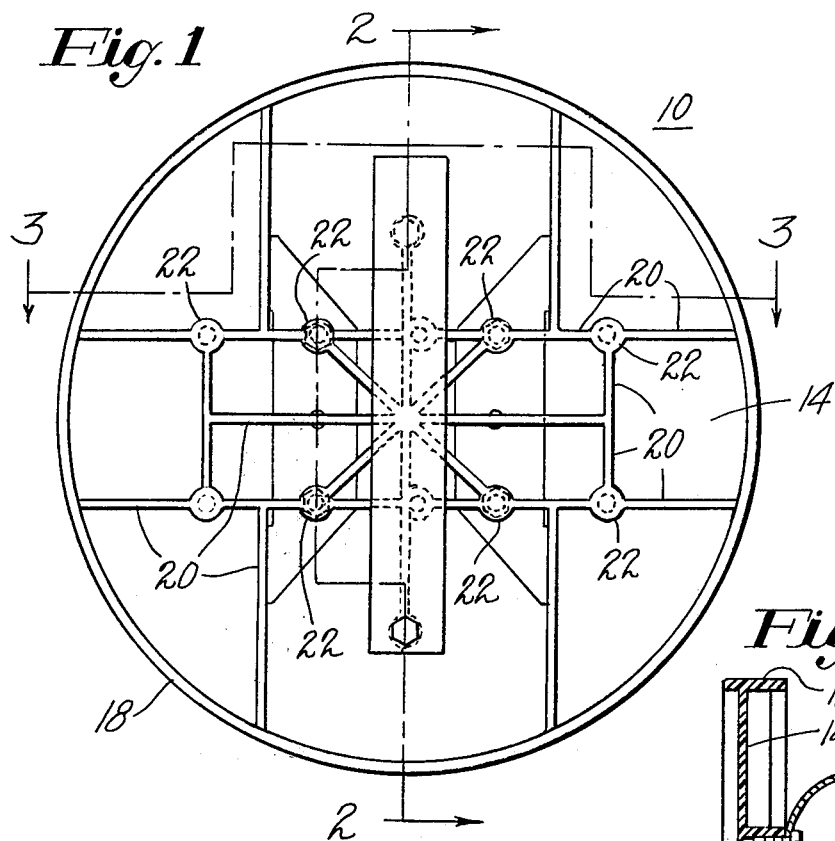
FIG. 1 is view in front elevation of a meter socket jumper assembly embodying the features of the invention.
Figure 2:
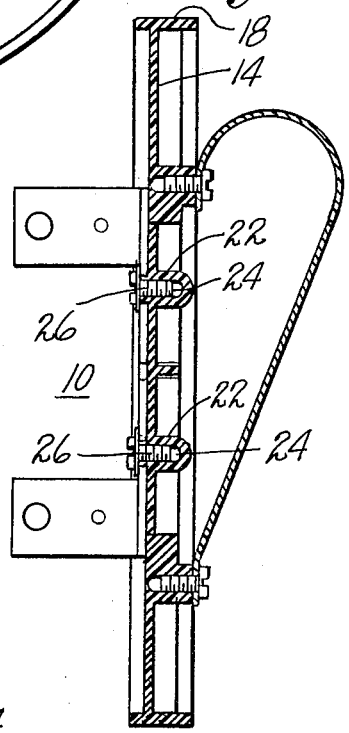
FIG. 2 is a view in section taken on line 2—2 of FIG. 1.
Figure 3:
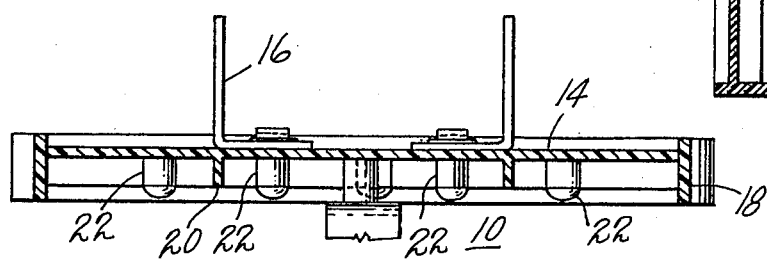
FIG. 3 is a view in section taken on line 3—3 of FIG. 1.
Figure 5:
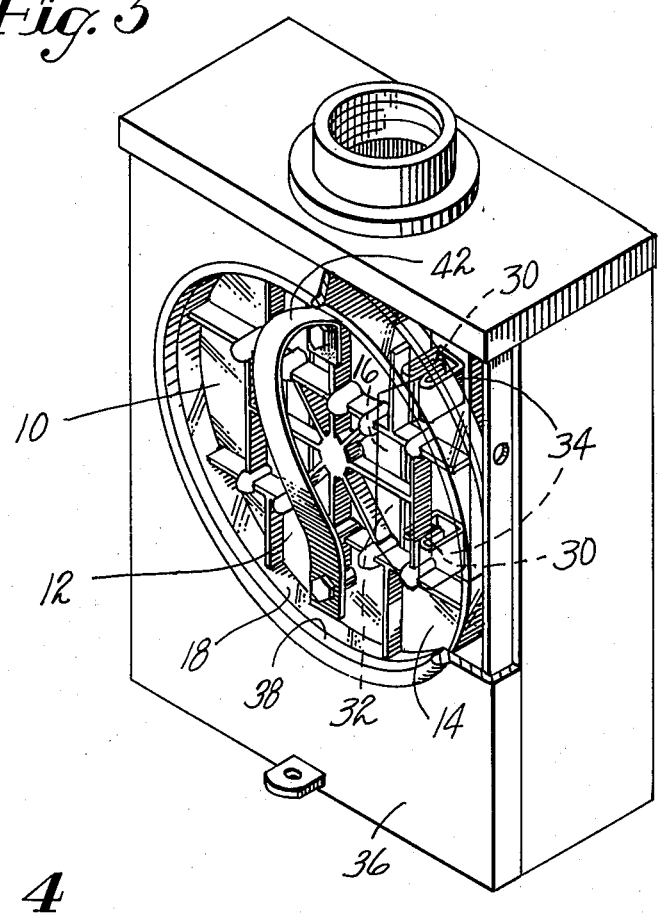
FIG. 5 is a perspective view of the meter socket jumper assembly of FIG. 1 assembled with a meter socket.
Figure 4:
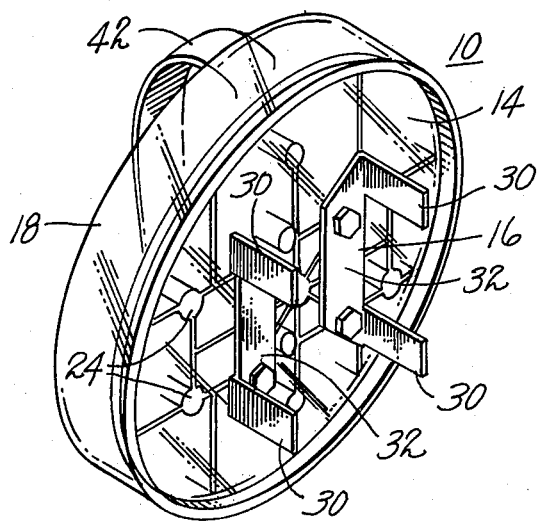
FIG. 4 is a perspective view of the rear side of the meter socket jumper assembly of FIG. 1.

Referring to the drawing, there is illustrated a meter socket jumper 10 intended for assembly with a meter socket 12, which comprises a plastic disc 14 and metallic jumpers 16 assembled onto the rear side thereof.

The disc 14 is circular in shape, with a diameter the same as that of a meter designed for assembly into said socket, and a peripheral flange 18 which has a width substantially the same as that of the flange on said meter so that the meter socket jumper assembly 10 may be assembled with a meter socket and be retained therein in the same manner as a meter as will be described more fully hereinafter.

The main body of the disc 14 is relatively thin, with a series of reinforcing ribs 20 formed on the forward face thereof. Intersecting the reinforcing ribs are a series of molded cylindrical walls 22 which extend from the forward face of the disc. Said walls are open at the rear end at the rear face of the disc but are closed on the forward end which protrudes from the forward side of the disc, forming pockets 24 which open to the rear side of the disc.

The pockets 24 have a diameter and depth appropriate for receiving self tapping screws 26 for attaching the conductive jumpers 16 to the rear side of the disc.

The jumpers 16 each comprise a pair of contact blades 30 and a connecting bar 32. The bar 32 is secured to the disc by the screws 26 seated in pockets 24.

In the usual case a pair of jumpers 16 are attached to the rear side of the disc, with the blades being spaced and dimensioned to be frictionally engagable with jaw contacts 34 in the meter socket, in the same manner as a meter.

The meter socket jumper assembly may therefore be assembled into the meter socket in the same manner as a meter, with the jumpers 16 completing a circuit from the live contact jaws to the load contact jaws. The assembly is retained in the meter socket initially by frictional engagement of the blades 30 in the socket jaws, and then by a cover plate 36 having a central aperture 38 which normally receives a meter housing. Since the periphery of the disc 14 has the same diameter and thickness as that of the retaining ring of a meter, the flange 18 is positioned in the meter socket by the usual meter positioning means and retained in the socket by the cover plate.

To facilitate insertion and removal of the assembly, a handle 42 may be attached by self-tapping screws to the forward face of the disc.

As illustrated in the drawing, a plurality of pockets may be provided opening to the rear face of the disc, so that jumpers may be assembled in different positions to allow the device to be used with sockets of different spacing and numbers of jaw contacts.

The pockets in the disc allow secure assembly of the jumpers onto the rear side of the disc, without exposure of any voltage carrying components on the front face of the disc, thus eliminating any possibility of electrical shock.

Although in the illustrated embodiment of the invention the disc is formed of transparent plastic, it may be formed of opaque material if desired.

Since certain changes apparent to one skilled in the art may be made in the herein illustrated and described embodiment of the invention without departing from the scope thereof, it is intended that all matter contained herein be interpreted in an illustrative and not a limiting sense.

I claim:

1. A cover for a meter socket adapted to receive jumpers for completing a circuit between meter socket terminals, said cover comprising a disc formed of insulating material, said disc having a peripheral flange having a diameter and thickness substantially the same as that of a retaining flange of a meter intended for assembly into said meter socket, a central portion substantially thinner than the width of said flange, and a series of cylindrical walls extending from said central portion, said walls being closed at the forward end on the forward side of the disc and open at the other end on the rear side of the disc forming a pocket, said walls being dimensioned to receive a fastening device from the rear side for attachment of a jumper without exposure of the fastening device on the forward side of the disc.

2. A cover for a meter socket as set out in claim 1 in which said walls protrude forwardly from the front surface of the disc, and reinforcing ribs are provided on the front surface of the disc, said ribs abutting said walls.

* * * * *